(12) United States Patent
Kawano et al.

(10) Patent No.: US 9,187,822 B2
(45) Date of Patent: Nov. 17, 2015

(54) METHOD FOR FORMING GE-SB-TE FILM AND STORAGE MEDIUM

(75) Inventors: Yumiko Kawano, Yamanashi (JP); Susumu Arima, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 13/825,579

(22) PCT Filed: Sep. 5, 2011

(86) PCT No.: PCT/JP2011/070150
§ 371 (c)(1),
(2), (4) Date: Mar. 22, 2013

(87) PCT Pub. No.: WO2012/043154
PCT Pub. Date: Apr. 5, 2012

(65) Prior Publication Data
US 2013/0183446 A1 Jul. 18, 2013

(30) Foreign Application Priority Data

Sep. 29, 2010 (JP) .................................. 2010-218529

(51) Int. Cl.
*C23C 16/00* (2006.01)
*C23C 16/06* (2006.01)
(Continued)

(52) U.S. Cl.
CPC ............... *C23C 16/06* (2013.01); *C23C 16/305* (2013.01); *C23C 16/44* (2013.01); *C23C 16/45523* (2013.01); *H01L 45/06* (2013.01); *H01L 45/144* (2013.01); *H01L 45/1616* (2013.01)

(58) Field of Classification Search
CPC C23C 16/45523; C23C 16/30; C23C 16/305; H01L 45/1616; H01L 45/06; H01L 45/144

USPC ............... 427/255.32, 248.1, 255.31, 255.29, 427/255.28, 255.23
See application file for complete search history.

(56) References Cited

U.S. PATENT DOCUMENTS

2006/0172067 A1* 8/2006 Ovshinsky et al. ........ 427/248.1
2006/0172083 A1* 8/2006 Lee et al. ...................... 427/535
(Continued)

FOREIGN PATENT DOCUMENTS

JP 2006-214005 A 8/2006
JP 2007-056369 A 3/2007
(Continued)

OTHER PUBLICATIONS

International Search Report issued on Sep. 21, 2011 for WO2012/043154A1.
(Continued)

*Primary Examiner* — Kelly M Gambetta
(74) *Attorney, Agent, or Firm* — Abelman, Frayne & Schwab

(57) ABSTRACT

Disclosed is a method for forming a Ge—Sb—Te film, in which a substrate is disposed within a process chamber, a gaseous Ge material, a gaseous Sb material, and a Te material are introduced into the process chamber, so that a Ge—Sb—Te film formed of $Ge_2Sb_2Te_5$ is formed on the substrate by CVD. The method for forming a Ge—Sb—Te film comprises: a step (step 2) wherein the gaseous Ge material and the gaseous Sb material or alternatively a small amount of the gaseous Te material not sufficient for formed of $Ge_2Sb_2Te_5$ in addition to the gaseous Ge material and the gaseous Sb material are introduced into the process chamber so that a precursor film, which does not contain Te or contains Te in an amount smaller than that in $Ge_2Sb_2Te_5$, is formed on the substrate; and a step (step 3) wherein the gaseous Te material is introduced into the process chamber and the precursor film is caused to adsorb Te, so that the Te concentration in the film is adjusted.

4 Claims, 11 Drawing Sheets

(51) Int. Cl.
*C23C 16/30* (2006.01)
*H01L 45/00* (2006.01)
*C23C 16/44* (2006.01)
*C23C 16/455* (2006.01)

(56) References Cited

U.S. PATENT DOCUMENTS

| | | | |
|---|---|---|---|
| 2007/0048977 A1* | 3/2007 | Lee et al. | 438/483 |
| 2007/0160760 A1* | 7/2007 | Shin et al. | 427/255.35 |
| 2012/0107505 A1* | 5/2012 | Kawano et al. | 427/255.32 |
| 2012/0329208 A1* | 12/2012 | Pore et al. | 438/102 |

FOREIGN PATENT DOCUMENTS

| | | |
|---|---|---|
| JP | 2007-186784 A | 7/2007 |
| JP | 2008-103731 A | 5/2008 |
| JP | 2008-528805 A | 7/2008 |
| JP | 2010-159471 A | 7/2010 |
| JP | 2010-287705 A | 12/2010 |
| KR | 2010-0082725 A | 7/2010 |
| WO | 2010-143571 A | 12/2010 |

OTHER PUBLICATIONS

Byung Joon Choi et al., Cyclic PECVD of Ge2Sb2Te5 films using metallorganic sources, Journal of the electrochemical society, vol. 154, No. 4, 2007, H318-H324.

Ju Heyuck Baeck et al., Electronic structure of Te/Sb/Ge and Sb/Te/Ge multi layer films using photoelectron spectroscopy, Journal of American chemical society, vol. 131, No. 38, 2009, 13634-13638.

Junghyun Lee et al., GeSbTe deposition for the PRAM application ,Applied surface science, vol. 253, No. 8, 2007, 3969-3976.

* cited by examiner

FIG.3.

| | SEM PHOTO OF FILM FORMED ON PATTERN | | | FILM COMPOSITION (at%) | | |
|---|---|---|---|---|---|---|
| | | | | Ge | Sb | Te |
| No.1 | | | | 15 | 52 | 33 |
| No.2 | | | | 22 | 35 | 43 |
| No.3 | | | | 17 | 30 | 53 |

METHOD FOR FORMING GE-SB-TE FILM AND STORAGE MEDIUM

CROSS REFERENCE TO RELATED APPLICATIONS

This application is a national phase of PCT application No. PCT/JP2011/070150, filed on 5 Sep. 2011, which claims priority to Japanese patent application No. 2010-218529, filed on 29 Sep. 2010, all of which are incorporated herein by reference.

TECHNICAL FIELD

The present invention relates to a method of forming a Ge—Sb—Te film that forms a Ge—Sb—Te film by CVD, and a storage medium in which a program is stored to execute the film forming method.

BACKGROUND

Recently, a phase change random access memory ("PRAM") that stores information using a phase change film is getting attention as a high-speed, long life-spanned non-volatile memory element. The phase change film is formed of a material that, when heated to a high temperature (e.g. 600° C. or more) and then quickly cooled, is turned into an amorphous phase that exhibits a high resistivity, and, when heated to a low temperature (e.g. 400° C. or more) and cooled slowly, is turned into a crystalline phase that exhibits a normal resistivity. A PRAM stores data using difference in resistivity of these two phases. This phase change is achieved by controlling the magnitude of a current pulse. That is, when a large current pulse is provided, an amorphous phase is obtained and, when a small current pulse is provided, a crystalline phase is obtained.

As for a phase change film material used for PRAM, $Ge_2Se_2Te_s$ which is a Ge—Sb—Te film is used (see, e.g., Patent Document 1). As described in Patent Document 1, although the Ge—Sb—Te film has been generally formed by PVD such as, for example, sputtering, a step coverage is not sufficient with the PVD. Therefore, an attempt to form a film using CVD has been made which is excellent in step coverage.

PRIOR ART DOCUMENT

Patent Document

Patent Document 1: Japanese Patent Laid-Open Publication No. 2008-103731

DISCLOSURE OF THE INVENTION

Problems to be Solved

It has been found out that, when such a Ge—Sb—Te film is formed using CVD by supplying a Ge compound, an Sb compound, and a Te compound simultaneously as film forming materials, a problem arises in that the composition controllability is poor and the flatness of a film surface is poor.

Therefore, an object of the present disclosure is to provide a method of forming a Ge—Se—Te film which is capable of obtaining a Ge—Sb—Te film that is excellent in composition controllability and superior in flatness, using CVD.

Also, another object of the present invention is to provide a storage medium in which a program is stored for executing the method for achieving the above-described object.

The inventors of the present application have investigated the reason why the above-described problems occur when a Ge—Sb—Te film formed of $Ge_2Sb_2Te_5$ is formed using CVD by supplying a gaseous Ge material, a gaseous Sb material, and a gaseous Te material simultaneously. Consequently, it has been found out that the surface flatness is deteriorated due to a large amount of Te, and an abrupt change in concentration of Te is caused due to a change in some condition in a region where the concentration of Te is in the range of 30 at % to 60 at %.

Through further investigation, it has been found out that the problems as described above do not occur when the Ge—Sb—Te film formed of $Ge_2Sb_2Te_5$ is formed by forming a precursor film that contains Ge and Sb, and does not contain Te or contains Te in an amount that does not cause the problems as described above, and then causing Te to be adsorbed to the precursor film. It also has been found out that a Ge—Sb—Te film formed of $Ge_2Sb_2Te_5$ having a desired composition and a film thickness without causing the problems as described above may be obtained by using a compound having an amino group or an amidine group as the Ge material and the Sb material, and a compound having an alkyl group as the Te material, and alternately supplying a material gas and a reaction gas to form each of a Ge film and an Sb film, then alternately supplying a material gas and a purge gas to form a Te film, and then repeating these steps by a predetermined number of times.

The present disclosure has been completed based on such findings.

Means to Solve the Problems

That is, according to a first aspect of the present disclosure, there is provided a method of forming a Ge—Sb—Te film formed of $Ge_2Sb_2Te_5$ on a substrate by CVD by disposing the substrate in a process chamber and using a gaseous Ge material, a gaseous Sb material, and a gaseous Te material. The method includes: introducing the gaseous Ge material and the gaseous Sb material, or alternatively a small amount of the gaseous Te material not sufficient to form $Ge_2Sb_2Te_5$ in addition to the gaseous Ge material and the gaseous Sb material into the process chamber so that a precursor film which does not contain Te or contains Te in an amount smaller than that in $Ge_2Sb_2Te_5$ is formed on the substrate; and introducing the gaseous Te material into the process chamber to cause Te to be adsorbed to the precursor film so that the concentration of Te in the film is adjusted.

In the first aspect, when forming the precursor film, the gaseous Ge material and the gaseous Sb material or alternatively the small amount of the gaseous Te material not sufficient to form $Ge_2Sb_2Te_5$ in addition to the gaseous Ge material and the gaseous Sb material may be supplied in a lump.

Also, the precursor film contains Ge in an amount smaller than that in $Ge_2Sb_2Te_5$ and the method may further include, after the forming of the precursor film and prior to the Te adsorption, introducing the gaseous Ge material into the process chamber to cause Ge to be adsorbed to the precursor film. In this case, it is desirable that the method further includes causing Ge to be adsorbed to the precursor film again, which is performed after Ge is caused to be adsorbed to the precursor film and then Te is caused to be adsorbed to the precursor film.

In addition, in the present disclosure, the Ge material and the Sb material may be a Ge compound that contains an amino group or an amidine group and an Sb compound that contains an amino group or an amidine group, respectively. When forming the precursor film, a reaction gas that decomposes the amino group or the amidine group may be supplied simultaneously with the Ge compound and the Sb compound. Further, as for the Te material, a compound that contains an alkyl group may be used.

According a second aspect of the present invention, there is provided a method of forming a Ge—Sb—Te film formed of $Ge_2Sb_2Te_5$ on a substrate by CVD by disposing the substrate in a process chamber and using a gaseous Ge material, a gaseous Sb material, and a gaseous Te material. The method includes: alternately supplying a Ge compound that contains an amino group or an amidine group as the gaseous Ge material and a reaction gas that decomposes the amino group or the amidine group into the process chamber by a predetermined number of times to form a Ge film; alternately supplying an Sb compound that contains an amino group or an amidine group as the gaseous Sb material and a reaction gas that decomposes the amino group or the amidine group into the process chamber by a predetermined number of times to form an Sb film; after the forming of the Ge film and the Sb film, alternately supplying a Te compound that contains an alkyl group as the gaseous Te material and a purge gas into the process chamber by a predetermined number of times to form a Te film; and repeating the above steps by a predetermined number of times.

In the second aspect, as for both the reaction gas that decomposes the amino group or the amidine group and the purge gas, $NH_3$ gas may be used.

According to a third aspect of the present invention, there is provided a storage medium which operates on a computer and stores a program that, when executed, controls a film forming apparatus in such a manner that the film forming apparatus conducts a method of forming a Ge—Sb—Te film formed of $Ge_2Sb_2Te_5$ on a substrate by CVD by disposing the substrate in the process chamber and using a gaseous Ge material, a gaseous Sb material, and a gaseous Te material. The method includes: introducing the gaseous Ge material and the gaseous Sb material, or alternatively a small amount of the gaseous Te material not sufficient to form $Ge_2Sb_2Te_5$ in addition to the gaseous Ge material and the gaseous Sb material into the process chamber so that a precursor film which does not contain Te or contains Te in an amount smaller than that in $Ge_2Sb_2Te_5$ is formed on the substrate; and introducing the gaseous Te material into the process chamber to cause Te to be adsorbed to the precursor film so that the concentration of Te in the film is adjusted.

According to a fourth aspect of the present invention, there is provided a storage medium which operates on a computer and stores a program which, when executed, controls a film forming apparatus in such a manner that the film forming apparatus conducts a method of forming a Ge—Sb—Te film formed of $Ge_2Sb_2Te_5$ on a substrate by CVD by disposing the substrate in a process chamber and using a gaseous Ge material, a gaseous Sb material, and a gaseous Te material. The method includes: alternately supplying a Ge compound that contains an amino group or an amidine group as the gaseous Ge material and a reaction gas that decomposes the amino group or the amidine group into the process chamber by a predetermined number of times to form a Ge film; alternately supplying an Sb compound that contains an amino group or an amidine group and a reaction gas that decomposes the amino group or the amidine group into the process chamber by a predetermined number of times to form an Sb film; after the forming of the Ge film and the Sb film, alternately supplying a Te compound that contains an alkyl group as the gaseous Te material and a purge gas into the process chamber by a predetermined number of times to form a Te film; and repeating the steps by a predetermined number of times.

BRIEF DESCRIPTION OF THE DRAWINGS

FIG. 3 illustrates scanning electron microscope ("SEM") photographs that show the surface conditions of films formed by one-step film forming while changing the Te concentrations in the films, respectively.

Detailed Description to Execute the Invention

Hereinafter, an exemplary embodiment of the present invention is described with reference to the accompanying drawings.

Here, descriptions will be made as to form a Ge—Sb—Te film as a phase-change layer of PRAM on a semiconductor wafer.

Although mL/min is used as a unit for gas flow rate in the following description, a value converted into a standard condition is used since the volume of a gas varies considerably according to a temperature and an atmospheric pressure. Also, because a flow rate converted into a standard condition is usually denoted as sccm (Standard Cubic Centimeter per Minute), "sccm" is indicated following a converted flow rate. The standard condition herein is a condition of a temperature of 0° C. (273.15 K) and a pressure of 1 atm (101,325 Pa).

Figure 1:
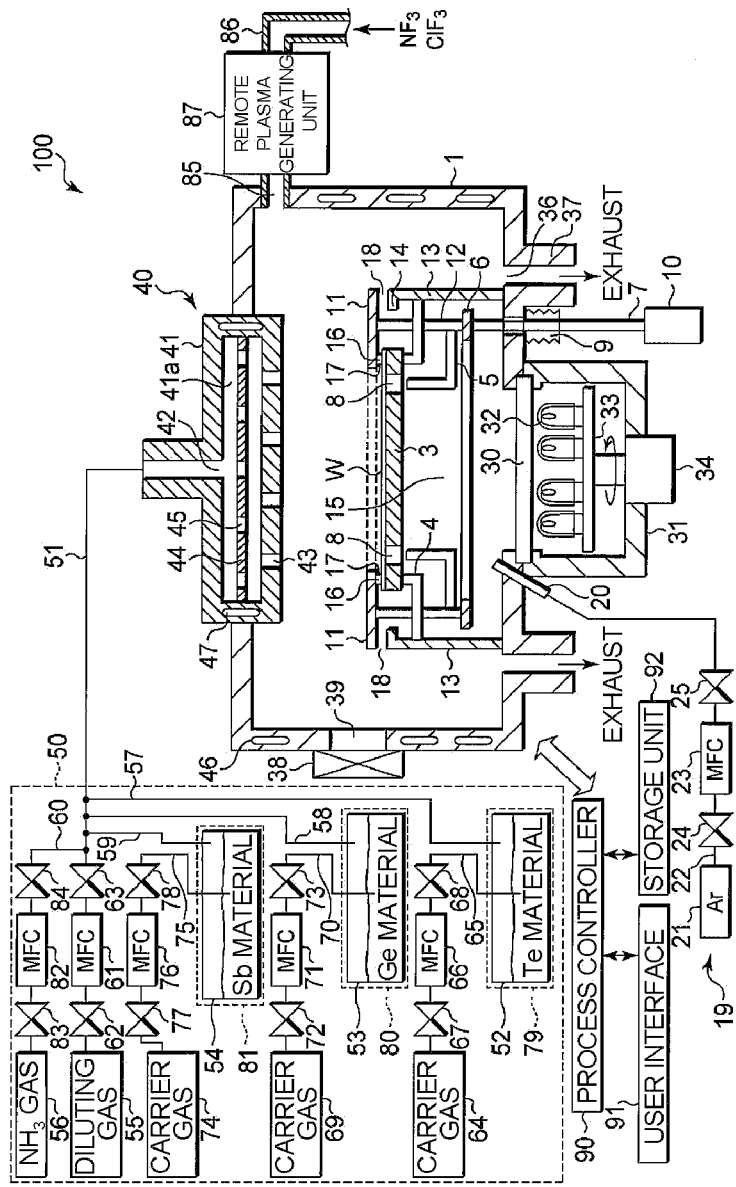
FIG. 1 is a cross-sectional view schematically illustrating a configuration of a film forming apparatus which may be used for conducting a method of forming a Ge—Sb—Te film according to the present disclosure.

FIG. 1 is a cross-sectional view schematically illustrating a configuration of a film forming apparatus which may be used for performing a method of forming a Ge—Sb—Te film according to the present disclosure. The film forming apparatus 100 illustrated in FIG. 1 has a process chamber 1 that is formed in a cylinder shape or a box shape from, for example, an aluminum and, in the inside thereof, is provided with a mounting table 3 on which a semiconductor wafer W which is a substrate to be processed (hereinafter, simply referred to as a "wafer") is mounted. Mounting table 3 is made of for example, a carbon material, such as, for example, a graphite plate or a SiC coated graphite plate, and ceramics such as, for example, aluminum nitride that exhibit a good heat conductivity and have a thickness of about 1 mm A cylindrical partitioning wall 13 made of, for example, an aluminum and put up on the bottom part of process chamber 1 is formed around the outer circumferential side of mounting table 3 and the top end of partitioning wall 13 is bent horizontally to form a bent part 14 of, for example, an L shape. By providing cylindrical partitioning wall 13, an inert gas purge chamber 15 is formed at the rear side of mounting table 3. The top surface of bent part 14 is positioned in a plane which is substantially the same as the top surface of mounting table 3 and is spaced apart from the outer periphery of mounting table 3, in which a connecting rod 12 is inserted through this gap. Mounting table 3 is supported by three (only two are depicted in the illustrated example) support arms 4 that extend from the upper side inner wall of partitioning wall 13.

A plurality of, for example, three L-shaped lifter pins 5 (only two lifter pins are depicted in the illustrated example) are installed under mounting table 3 to protrude upward from a support member 6 of a ring shape. Support member 6 is configured to be capable of ascending/descending by an elevating rod 7 installed through the bottom part of process chamber 1. Elevating rod 7 is configured to be capable of ascending/descending by an actuator 10 located under process chamber 1. In the portions of mounting table 3 that correspond to lifter pins 5, through holes 8 are formed, respectively. When lifter pins 5 ascend through elevating rod 7 and support member 6 by actuator 10, lifter pins 5 are respectively inserted into through holes 8 to be capable of lifting wafer W. The portion of elevating rod 7 inserted into process chamber 1 is covered with a bellows to suppress ambient air from infiltrating into process chamber 1 from the inserted portion.

At the peripheral edge of mounting table 3, a clamp ring member 11 formed of a ceramic such as, for example, aluminum nitride, of an approximately ring shape following the contour shape of wafer W is installed in order to hold the peripheral edge of wafer W to fix wafer W on mounting table 3. Clamp ring member 11 is connected with support member 6 through connecting rods 12 and is configured to ascend/descend together with lifter pins 5. Lifter pins 5 or connecting rods 12 are formed of, for example, a ceramic, e.g. alumina.

On the bottom surface of the inner peripheral side of clamp ring member 11 of the ring shape, a plurality of contact protrusions 16 are formed which are substantially equally spaced along the peripheral direction and at the time of clamping, the lower end face of each of the contact protrusions comes into contact with and presses the top surface of the peripheral edge of wafer W. Also, the diameter of each of contact protrusions 16 is about 1 mm and the height thereof is about 50 μm, and at the time of clamping, a first gas purge gap 17 of a ring shape is formed in this part. In addition, the overlap amount between the peripheral edge of wafer W and the inner peripheral side of clamp ring member 11 (the flow path length of first gas purge gap 17) is about a few mm The outer peripheral edge of clamp ring member 11 is positioned above the top surface of bent part 14 at the top end of partitioning wall 13 and a second gas purge gap 18 of a ring shape is formed herein. The width (height) of second gas purge gap 18 is, for example, about 500 μm which is about ten times wider than that of first gas purge gap 17. The overlap amount of the outer peripheral edge of clamp ring member 11 and bent part 14 (the flow path length of second gas purge gap 18) is, for example, about 10 mm. Accordingly, the inert gas in the inside of inert gas purge chamber 15 may flow out from both gaps 17, 18 to a processing space side.

In the bottom part of process chamber 1, an inert gas supply mechanism 19 that supplies inert gas to inert gas purge chamber 15 is installed. This inert gas supply mechanism 19 includes: a gas nozzle 20 configured to introduce an inert gas, for example, Ar gas (backside Ar) into inert gas purge chamber 15; an Ar gas supply source 21 configured to supply Ar gas as the inert gas; and a gas pipe 22 configured to guide the Ar gas into gas nozzle 20 from Ar gas supply source 21. In addition, gas pipe 22 is provided with a mass flow controller 23 as a flow controller and opening/closing valves 24, 25. As for the inert gas, other rare gases, for example, He gas may be used instead of the Ar gas.

At a position in the bottom part of process chamber 1 just below mounting table 3, a transmissive window 30 formed of a heat ray transmissive material, for example, quartz is installed hermetically, and a box-shaped heating chamber 31 is provided below transmissive window 30 to surround transmissive window 30. In heating chamber 31, a plurality of heating lamps 32 as heating means are attached to a rotation table 33 that also serves as a reflector. Rotation table 33 is rotated by a rotation motor 34 installed at the bottom part of heating chamber 31 through a rotation shaft. Therefore, heat rays emitted from heating lamps 32 penetrate transmissive window 30 and irradiates and hence heats the bottom surface of mounting table 3.

In addition, around the peripheral edge of the bottom part of process chamber 1, an exhaust port 36 is provided to which an exhaust pipe 37 is connected. Exhaust pipe 37 is connected to a vacuum pump which is not depicted. By exhausting gas through exhaust port 36 and exhaust pipe 37, process chamber 1 may be maintained at a predetermined degree of a vacuum. A carrying-in/carrying-out entrance 39 through which wafer W is carried into or out from process chamber 1 and a gate valve 38 which opens/closes carrying-in/carrying-out entrance 39 are provided in the side wall of process chamber 1.

Meanwhile, on the ceiling part of process chamber 1 facing mounting table 3, a shower head 40 is installed to introduce, for example, a source gas into process chamber 1. Shower head 40 is provided with a head body 41 which is made of, e.g. an aluminum and formed in a disk shape to have a space 41a therein. At the ceiling part of head body 41, a gas inlet 42 is provided. Gas inlet 42 is connected to a processing gas supply mechanism 50 configured to supply a processing gas required for forming a Ge—Sb—Te film through a pipe 51. In the bottom part of head body 41, a plurality of gas spray holes 43 are arranged over the entirety of the bottom part of head body 41 to release a gas supplied into head body 41 to the processing space inside process chamber 1 and to release the gas to the entire surface of wafer W. In addition, in space 41a inside head body 41, a diffusion plate 44 having a plurality of gas dispersion holes 45 is arranged so that the gas can be supplied more uniformly. Also, in the inside of the side wall of process chamber 1, in the inside of the side wall of shower head 40 and in the wall formed with gas spray holes 43 and facing wafer surface, cartridge heaters 46, 47 are installed each of which is configured to adjust the temperature so that the side wall that is also contacted with the source gas and the shower head part may be maintained at a predetermined temperature.

Processing gas supply mechanism 50 includes: a Te material storage 52 configured to store a Te material; a Ge material storage 53 configured to store a Ge material; an Sb material storage 54 configured to store an Sb material; a diluting gas supply source 55 configured to supply a diluting gas, for example, an argon gas to dilute the gas inside process chamber 1; and a $NH_3$ gas supply source 56 configured to supply $NH_3$ gas as a reaction gas which decomposes a material gas. Also, the reaction gas is not limited to $NH_3$ gas.

On the way of pipe 51 connected to shower head 40, a pipe 57 extending from Te material storage 52, a pipe 58 extending from Ge material storage 53, a pipe 59 extending from Sb material storage 54, and a pipe 60 extending from $NH_3$ gas supply source 56 are connected. Diluting gas supply source 55 is connected to the end of pipe 51 opposite to shower head 40. Pipe 51 is equipped with a mass flow controller (MFC) 61 as a flow controller and opening/closing valves 62, 63 at the upstream and downstream sides of mass flow controller 61. Pipe 60 is equipped with a mass flow controller (MFC) 82 as a flow controller and opening/closing valves 83, 84 at the upstream and downstream sides of the mass flow controller 82.

A carrier gas supply source 64 configured to supply a carrier gas for bubbling, e.g. Ar is connected to Te material storage 52 through a pipe 65. Pipe 65 is equipped with a mass flow controller (MFC) 66 as a flow controller and opening/closing valves 67, 68 at the upstream and downstream sides of mass flow controller 66. A carrier gas supply material 69 configured to supply a carrier gas, e.g. Ar is connected to Ge material storage 53 through a pipe 70. Pipe 70 is equipped with a mass flow controller (MFC) 71 as a flow controller and opening/closing valves 72, 73 at the upstream and downstream sides of mass flow controller 71. A carrier gas supply source 74 configured to supply a carrier gas, e.g. Ar is connected Sb material storage 54 through a pipe 75. Pipe 75 is equipped with a mass flow controller (MFC) 76 as a flow controller and opening/closing valves 77, 78 at the upstream and downstream sides of mass flow controller 76.

Te material storage 52, Ge material storage 53, and Sb material storage 54 are equipped with heaters 79, 80, 81, respectively. And, the Te material stored in Te material storage 52, the Ge material stored in Ge material storage 53, and the Sb material stored in Sb material storage 54 are adapted to be supplied in a vaporized state to process chamber 1 by bubbling. Although not depicted, heaters are also provided in the pipes connected to process chamber 1 and the mass flow controllers which supply the Te material, the Ge material, and the Sb material in the vaporized state.

In addition, although an example in which the Te material and the Ge material and the Sb material are supplied by bubbling is described herein, these materials may also be supplied using a mass flow controller. Further, a material in a liquid state may be subjected to flow control by a liquid mass flow controller and then sent to a vaporizer so that the material is vaporized in the vaporizer and then supplied. Further, in FIG. 1, for example, although each material gas, the diluting gas, and the $NH_3$ gas are introduced to shower head 40 from a single pipe 51, it is needless to be limited thereto. For example, the gases may be divided into a group consisting of the Ge material and the Sb material and a group consisting of the Te material, the diluting gas, and the $NH_3$ gas and introduced into shower head 40 from two pipes. Moreover, the gases of these groups may be mixed in process chamber 1 for the first time rather than being mixed in shower head 40.

At the upper portion of the side wall of process chamber 1, a cleaning gas inlet 85 configured to introduce $NF_3$ gas or $ClF_3$ gas which is a cleaning gas is provided. A pipe 86 configured to supply the $NF_3$ gas or $ClF_3$ gas is connected to cleaning gas inlet 85 and equipped with a remote plasma generating unit 87. In this remote plasma generating unit 87, e.g. $NF_3$ gas supplied through pipe 86 is turned into plasma and supplied into process chamber 1, thereby cleaning the inside of process chamber 1. Remote plasma generating unit 87 may also be provided just above shower head 40 so that the cleaning gas may be supplied through shower head 40. As for the cleaning gas, $F_2$ gas may also be used besides the $NF_3$ gas or the $ClF_3$ gas. When the $ClF_3$ gas is used as the cleaning gas, the remote plasma may not be used and a heat cleaning may be performed without plasma.

Film forming apparatus 100 is equipped with a process controller 90 configured by a microprocessor (computer) and each configuration part of film forming apparatus 100 is connected to and controlled by process controller 90. Also, to process controller 90, a user interface 91 is connected which includes, for example, a keyboard configured such that an operator performs, e.g. an input operation of a command in order to manage each configuration part of film forming apparatus 100, and a display visually configured to visualize and display an operating situation of each configuration part of film forming apparatus 100. In addition, to process controller 90, a storage unit 92 is connected which stores a control program programmed to realize various processes executed in film forming apparatus 100 and a control program that executes a predetermined processing in each configuration part of film forming apparatus 100 according to a processing condition, for example, a processing recipe or various databases. The processing recipe is stored in a storage medium (not illustrated) in storage unit 92. The storage medium may be, for example, a hard disc that is fixedly installed, or may be, for example, a CDROM, a DVD or a flash memory that is transportable. Further, the recipe may be transmitted from other apparatuses through, for example, a dedicated line.

In addition, a predetermined processing recipe may be called from storage unit 92 by a command from user interface 91 as desired to be executed in process controller 90 so that a desired processing in film forming apparatus 100 is performed under the control of process controller 90.

Next, descriptions will be made as to the aspects of a film forming method performed using the film forming apparatus configured as described above.

[First Aspect]

In the present aspect, a Ge—Sb—Te film formed of $Ge_2Sb_2Te_5$ is formed on a wafer W by CVD by disposing a wafer W in a process chamber 1 and using a gaseous Ge material, a gaseous Sb material, and a gaseous Te material, in which the gaseous Ge material and the gaseous Sb material, or alternatively a small amount of the gaseous Te material not sufficient to form $Ge_2Sb_2Te_5$ in addition to the gaseous Ge material and the gaseous Sb material are introduced into process chamber 1 to form a precursor film which does not contain Te or contains Te in an amount smaller than that in $Ge_2Sb_2Te_s$, and then the gaseous Te material is introduced into process chamber 1 to cause Te to be adsorbed to the precursor film to form a Ge—Sb—Te film of which the composition ratio is $Ge_2Sb_2Te_5$.

When a conventional CVD method (one step deposition) is employed in which a gaseous Ge material, a gaseous Sb material, and a gaseous Te material are introduced into a process chamber in a lump to form a Ge—Sb—Te film on a wafer W, the compositional stability is poor because Te concentration fluctuates abruptly in a film composition even with a slight change of flow rate of the carrier gas of the Ge material in a region where the Te concentration is in the range of 30 at % to 60 at %. In addition, when the Te concentration exceeds 40 at %, the flatness of the film surface tends to be degraded. These are illustrated in FIGS. 2 and 3.

Figure 2:
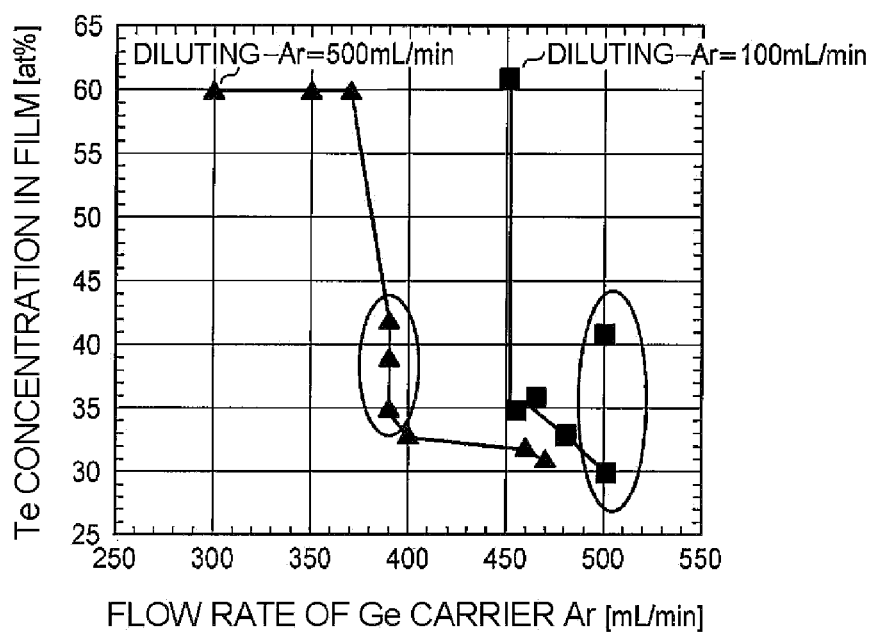
FIG. 2 illustrates a relationship between the flow rate of a carrier gas of a Ge material and the concentration of Te in a film formed by one-step film forming

FIG. 2 illustrates a relationship between the flow rate of the carrier gas of the Ge material and the Te concentration in a film when the film was formed by one step deposition by using a Ge compound containing an amino group or an amidine group as the Ge material, an Sb compound containing an amino group or an amidine group as the Sb material, and an alkyl based Te compound as the Te material, fixing the flow rate of the carrier gas of the Sb material to 8 mL/min (sccm), the flow rate of the carrier gas of the Te material to 100 mL/min (sccm), the film forming temperature to 265° C., and the pressure in the process chamber to 2,666 Pa (20 Torr), and setting the flow rate of Ar as the diluting gas to 500 mL/min (sccm) and to 100 mL/min (sccm). As illustrated in the figure, it can be seen that the Te concentration fluctuates abruptly between 30 at % and 60 at % with a slight change of the carrier gas of the Ge material, and thus, the composition control is very difficult when $Ge_2Sb_2Te_5$ is formed by one-step deposition.

FIG. 3 illustrates SEM photographs that show the surface conditions of films at individual film compositions when the films were formed on a silicon wafer with a trench and hole pattern by one-step deposition by using a Ge compound that contains an amino group or an amidine group as the Ge material, an Sb compound that contains an amino group or an amidine group as the Sb material, and an alkyl based Te compound as the Te material, supplying these materials into the process chamber while adjusting the flow rates thereof, and setting the film forming temperature to 260° C. and the pressure in the process chamber to 1,333 Pa (10 Torr). As illustrated in the figure, it can be seen that when the Te concentration in the film is 33 at %, the surface of the film becomes flattened but when the Te concentration exceeds 40 at %, the flatness of the surface of the film is deteriorated. In particular, it can be seen that the film where the Te concentration is 53 at % that is substantially the same as that in $Ge_2Sb_2Te_5$ is very poor in flatness. It is believed that such deterioration of the surface flatness resulted from a large amount of Te is caused because crystallization occurs simultaneously with film forming when $Ge_2Sb_2Te_5$ is formed by one-step deposition while the film is being formed at a film forming temperature of 150° C. or more.

For this reason, as described above, the present aspect adjusts the composition by causing Te to be adsorbed to a precursor film after the precursor film with a low Te content is formed In the present aspect, as for the Ge material, the Sb material, and the Te material, any compound may be used as long as the compound is capable of being supplied as a gas. A compound which is high in vapor pressure is advantageous since it is easily vaporized. For example, a compound that contains an amino group or an amidine group or a compound that contains an alkyl group may be used. As for the Ge material and the Sb material, a compound that contains an amino group or an amidine group may be preferably used. In order to enhance the flatness of the Ge—Sb—Te film, it is effective to avoid forming a $Ge_2Sb_2Te_5$ film by one-step as described above and to lower the film forming temperature. In order to lower the film forming temperature, it is effective to lower the decomposition temperatures of the Ge, Sb, and Te material gases. The decomposition temperature of a compound that contains an amino group or an amidine group is lower than that of a compound that contains an alkyl group. When comparing an amino group and an amidine group, a compound that contains an amidine group is somewhat more easily decomposed as compared to a compound that contains an amino group. Therefore, as for the materials, it is desirable to use a compound that contains an amino group rather than an alkyl group, and to use a compound that contains an amidine group rather than an amino group if those materials may be synthesized. As for the Te material, a compound that contains an alkyl group may be preferably used since there is no example of synthesis of an amino group or an amidine group. In addition, it is desirable that the decomposition temperatures of the Ge, Sb, and Te materials are the same if possible. Otherwise, a drawback may occurs in that, for example, if any one of these temperatures is particularly low, an abnormal growth of the corresponding component is caused, and if any one of these temperatures is particularly high, it is difficult for the corresponding component to infiltrate into the film.

As for the Ge compound that contains an amino group or an amidine group, $Ge(N(CH_3)_2)_4$, GeM (manufactured by ATMI), and TSC-Ge07 (manufactured by Tri Chemical Lab) may be referred to. As for the Sb compound that contains an amino group or an amidine group, for example, $Sb(N(CH_3)_2)_3$ and $RC(NR')SbC_{12}$ (R=tBu, R'=iPr) may be referred to. In addition, as for the Te compound that contains an alkyl group, for example, di-isopropyl-tellurium $[Te(i-C_3H_7)_2]$, di-tertiary-butyl $[Te(t-C_4H_9)_2]$, di-ethyl-tellurium $[Te(C_2H_5)_2]$, and TSC-Te06 (manufactured by Tri Chemical Lab) may be referred to.

Hereinafter, descriptions will be made as to exemplary embodiments. In the exemplary embodiments below, as for the Ge material and the Sb material, a compound that contains an amino group or an amidine group is used, and as for the Te material, an alkyl based compound is used.

[First Exemplary Embodiment]

Figure 4:
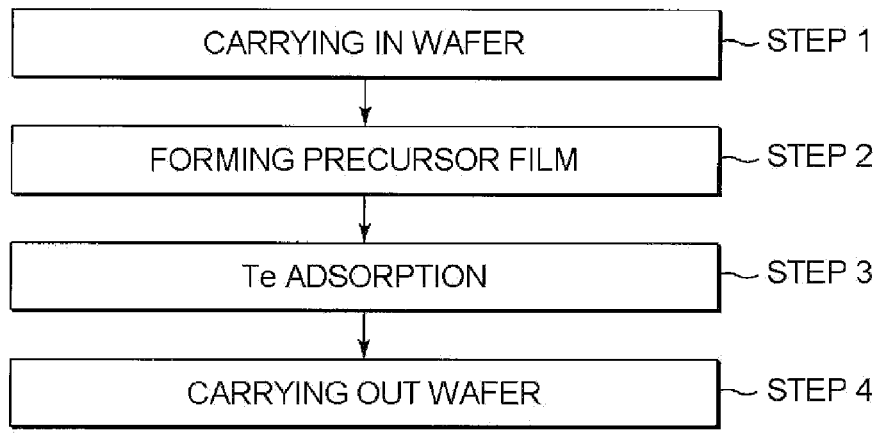
FIG. 4 is a flowchart illustrating a first exemplary embodiment of the first aspect of the film forming method according to the present disclosure.

With reference to FIG. 4, descriptions are made as to a film forming method according to the first exemplary embodiment of the first aspect.

First, gate valve 38 is opened, and a wafer W is introduced into process chamber 1 through carrying-in/carrying-out entrance 39 to be disposed on mounting table 3 (step 1). Then, gate valve 38 is closed, and the inside of process chamber 1 is exhausted so that the degree of vacuum of process chamber 1 is adjusted to a predetermined level. Mounting table 3 has been heated in advance by heat rays that have been released from heating lamps 32 and then transmitted through transmissive window 30, and wafer W is heated by the heat of the mounting table 3.

Next, a Ge compound gas that contains an amino group or an amidine group which is the Ge material gas, and an Sb compound gas that contains an amino group or an amidine group which is the Sb material gas are supplied at a predetermined flow rate, and a Te material gas is not supplied or a small amount of the Te material gas not sufficient to form Ge$_2$Sb$_2$Te$_5$ is supplied to form a precursor film on wafer W which is formed of a GeSb film or a Ge—Sb—Te film containing a small amount of Te (step 2).

In forming the precursor film, firstly the inside of process chamber 1 is exhausted through exhaust port 36 and exhaust pipe 37 using a vacuum pump (not illustrated) while supplying, for example, Ar gas as the diluting gas from diluting gas supply source 55, so that the inside of process chamber 1 is vacuum-exhausted to a pressure in the range of 60 Pa to 1,330 Pa. At this time, the heating temperature of wafer W is set to, for example, 200° C. to 600° C., preferably 230° C. to 360° C.

Then, the pressure in process chamber 1 is controlled to be 60 Pa to 6,650 Pa, preferably 500 Pa to 3,000 Pa which are film forming pressure while the flow rate of the diluting gas, for example, Ar gas is being maintained at 200 mL/min (sccm) to 1,000 mL/min (sccm), thereby initiating practical film forming. The adjustment of pressure in process chamber 1 is performed by an automatic pressure controller (APC) installed in exhaust pipe 37.

In this state, a carrier gas is caused to flow at a predetermined flow rate so that the Ge compound gas that contains an amino group or an amidine group which is the Ge material gas and the Sb compound gas that contains an amino group or an amidine group which is the Sb material gas are supplied from Ge material storage 53 and Sb material storage 54 in a lump into process chamber 1 by bubbling. Alternatively, in addition to this, for example, a carrier gas is caused to flow at a predetermined flow rate so that a small amount of the Te compound gas that contains an alkyl group which is the Te material gas is supplied from Te material storage 52 in a lump into process chamber 1 by bubbling. At this time, NH$_3$ gas is supplied from NH$_3$ gas supply source 56 into process chamber 1 as a reaction gas to decompose the amino group or the amidine group of the compound that contains the amino group or the amidine group which form the Ge material and the Sb material. As a result, a precursor film formed of a GeSb film or a GeSbTe film that contains a small amount of Te is formed on wafer W. At this time, it is desirable to control the flow rates of the carrier gases in such a manner that the ratio of Ge and Sb in the precursor film becomes 1:1 which equals to the ratio of Ge and Sb in Ge$_2$Sb$_2$Te$_5$. The flow rates of the carrier gases and the time for forming the film are determined properly according to the thickness of the film desired to obtain.

In forming the precursor film in step 2, the amount of Te is allowed when it is not sufficient to form Ge$_2$Sb$_2$Te$_5$. Specifically, since, when causing Te to be contained, the amount of Te should be less than 10 at %, the Te material gas is supplied to be not more than the amount.

When the forming of the precursor film in step 2 is terminated, the supply of the Ge material gas and the Sb material gas is stopped, and a predetermined amount of the Te gas is caused to flow such that Te is adsorbed to the precursor film formed in step 2 to adjust the Te concentration in the film (step 3). As a result, a Ge—Sb—Tb formed of Ge$_2$Sb$_2$Te$_5$ may be obtained. The Te compound that contains an alkyl group is hard to be decomposed alone to such an extent that Te is deposited (adsorbed) when the film forming temperature is in the range of 230° C. to 360° C. However, according to the inventor's various investigations, the decomposition of the Te compound may be facilitated under the existence of a remaining gas of the Ge material or the Sb material, especially the Sb material, Te may be deposited (adsorbed).

Figure 5:
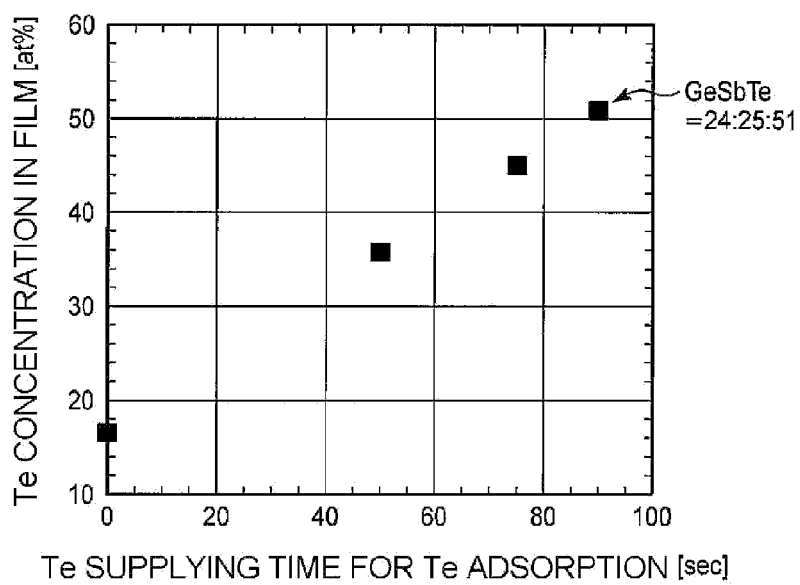
FIG. 5 illustrates a relationship between the time for supplying a Te material and the concentration of Te in a precursor film in the Te adsorption process after forming the precursor film.

In step 3, the carrier gas is caused to flow at a predetermined flow rate in a state where the heating temperature of wafer W is controlled to be 200° C. to 600° C., preferably to be 230° C. to 360° C. and the pressure in process chamber 1 is controlled to be 60 Pa to 6,650 Pa, preferably to be 500 Pa to 3,000 Pa which is the film forming pressure so that the Te material gas is introduced into process chamber 1 from Te material storage 52 by bubbling. As a result, Te is diffused into the precursor film to form Ge$_2$Sb$_2$Te$_5$. The Te concentration in the film at this time may be adjusted based on the flow rate of the Te material gas (the flow rate of the carrier gas) and the supplying time. When the flow rate is constant, the Te concentration may be adjusted based on the supplying time as illustrated in FIG. 5. FIG. 5 illustrates a relationship between the supplying time of the Te material gas and the Te concentration in a film when GeM (trademark) manufactured by ATMI is used as the Ge compound that contains an amino group or an amidine group which is the Ge material, Sb(N(CH$_3$)$_2$)$_3$ is used as the Sb compound that contains an amino group or an amidine group which is the Sb material, Te(t-C$_4$H$_9$)$_2$ is used as the Te compound that contains an alkyl group and is the Te material, the film forming temperature is set to 260° C., the pressure in the process chamber at the time of film forming is set to 2,666 Pa (20 Torr), the forming of the precursor film in step 2 is performed by setting the flow rate of the carrier gas of the Ge material gas to 500 mL/min (sccm), the flow rate of the carrier gas of the Sb material gas to 8 mL/min (sccm), and the flow rate of the carrier gas of the Te material gas to 20 mL/min (sccm), and then the Te material gas is supplied by setting the flow rate of the carrier gas of the Te material gas to 100 mL/min (sccm). As illustrated in the figure, it can be seen that the Te concentration in the film is increased substantially in proportion to the supplying time of the Te material gas when step 3 is performed, and thus, the composition of the film may be the composition of Ge$_2$Sb$_2$Te$_5$.

In addition, the flow rate and the supplying time of the carrier gas when the Te material gas is supplied may be properly set in such a manner that a desired Te concentration may be obtained, and preferably in the ranges of 10 mL/min (sccm) to 200 mL/min (sccm) and 10 sec to 120 sec, respectively. When a Te compound that contains an alkyl group is used as the Te material, it is not required to supply NH$_3$ gas as the reaction gas. However, the NH$_3$ gas may be supplied as a gas for improving the quality of the film. As for the gas for improving the quality of the film, H$_2$ gas may also be used.

After step 3 is terminated, the supply of the materials is stopped, the inside of process chamber 1 is purged by a diluting gas, and then gate valve 38 is opened so that a wafer W formed with the film is carried out from process chamber 1 (step 4). As a result, the film forming processing for one wafer is completed.

Since the Ge—Sb—Te film of the Ge$_2$Sb$_2$Te$_5$ composition formed as described above is formed by forming a precursor film which does not contain Te or contains a small amount of Te at first, and then causing Te to be adsorbed to the precursor film, the deterioration of the surface flatness and the degradation of the stability in Te concentration which are caused due to a large amount of Te as in the case where the Ge—Sb—Te film of the Ge$_2$Sb$_2$Te$_5$ composition is formed by one step deposition may be suppressed.

Figure 6:
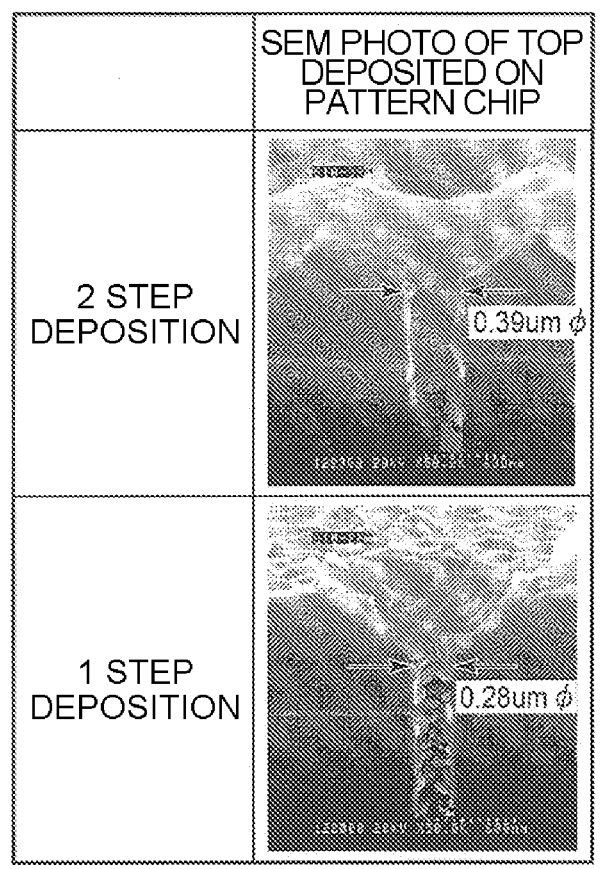
FIG. 6 illustrates SEM photographs of the surface of a Ge—Sb—Te film formed by two-step film forming of the first exemplary embodiment of the first aspect in which Te is adsorbed to a precursor film after forming the precursor film, and the surface of a Ge—Sb—Te film formed by one-step film forming.

FIG. 6 illustrates SEM photographs of a surface of the Ge—Sb—Te film formed by two-step deposition of the present aspect in which Te was adsorbed after the precursor film was formed, and a surface of the Ge—Sb—Te film formed by one-step deposition, using GeM as the Ge compound that contains an amino group or an amidine group which is the Ge material, Sb(N(CH$_3$)$_2$)$_3$ as the Sb compound that contains an amino group or an amidine group which is the Sb material, and Te(t-C$_4$H$_9$)$_2$ as the Te compound that contains an alkyl group which is the Te material. Here, in the two-step deposition, Ge was 26 at %, Sb was 15 at %, and Te was 59 at %, and in the one-step deposition, Sb was 11 at %, Sb was 28 at %, and Te was 61 at %. It can be seen that, although the Te contents were almost equal to each other, the film formed by two-step deposition of the present aspect is excellent in surface flatness as compared to the film formed by one-step deposition. In addition, the specific resistance of the film formed by the two-step deposition was 621.9 μΩ·cm which is also lower than 799.2 μΩ·cm of the film formed by the one-step deposition.

[Second Exemplary Embodiment]

Figure 7:
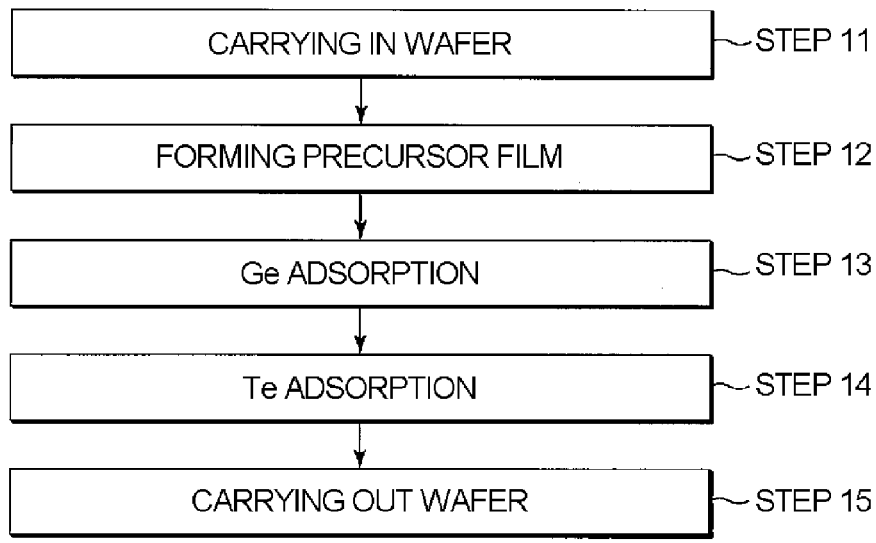
FIG. 7 is a flowchart illustrating a second exemplary embodiment of the first aspect of the film forming method according to the present disclosure.

A film forming method according to the second exemplary embodiment of the first aspect will be described with reference to FIG. 7.

First, as in step 1 in the first exemplary embodiment, a wafer W is carried into process chamber 1 and disposed on mounting table 3 (step 11). Then, wafer W is heated.

Next, a Ge material gas and an Sb material gas are supplied at a predetermined flow rate, and a Te material gas is not supplied or the Te material gas is supplied in a small amount not sufficient to form $Ge_2Sb_2Te_5$ so that a precursor film formed from a Ge—Sb film or a Ge—Sb—Te film that contains a small amount of Te is formed on wafer W (step 12). In the present exemplary embodiment, a precursor film is formed that contains Ge in an amount smaller than that in a state where the ratio of Ge to Sb is 1:1 which equals to the ratio of Ge to Sb in $Ge_2Sb_2Te_5$. This step is performed in the same manner as step 2 in the first exemplary embodiment except that the amount of Ge is small.

When the forming of the precursor film in step 12 is terminated, the supply of the Sb material gas or the supply of the Sb material gas and the Te material gas is stopped, and the Ge material gas (a Ge compound gas that contains an amino group or an amidine group) is caused to flow at a predetermined flow rate so that Ge is adsorbed to the precursor film formed in step 12 to adjust the concentration of Ge in the film (step 13). At step 13, a predetermined flow rate of a carrier gas is caused flow in a state where the heating temperature of wafer W is controlled to be, for example, 200° C. to 600° C., preferably, to be 230° C. to 360° C., and the pressure in process chamber 1 is controlled to be, for example 60 Pa to 6,650 Pa, preferably, to be 500 Pa to 3,000 Pa so that the Ge material gas is introduced into process chamber 1 from Ge material storage 53 by bubbling. At this time, the Ge concentration in the film may be adjusted based on the flow rate of the Ge material gas (the flow rate of the carrier gas) and the supplying time of the Ge material gas. When the flow rate is constant, the Ge concentration may be adjusted based on the supplying time.

When the adsorption of Ge at step 13 is terminated, the supply of the Ge material gas is stopped, and the Te material gas is caused to flow at a predetermined flow rate so that Te is adsorbed to the film formed at step 13 to adjust the concentration of Te in the film. As a result, a Ge—Sb—Te film formed of $Ge_2Sb_2Te_5$ may be formed. Thereafter, the wafer is carried out as in step 4 as described above (step 15).

Figure 8:
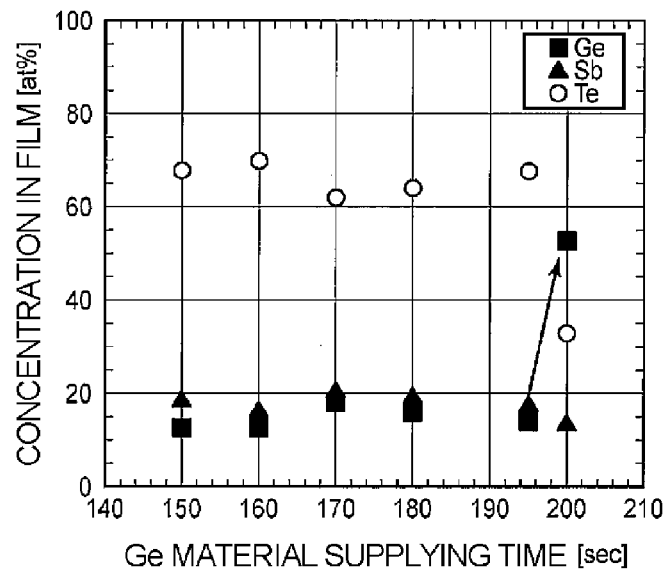
FIG. 8 illustrates a relationship between the time for supplying the Ge material and the concentrations of Ge, Sb, and Te in a film.

As described above, the Te compound containing an alkyl group is hard to be decomposed alone at a film forming temperature between 230° C. to 360° C. to such an extent that Te is deposited (adsorbed). However, under the existence of a remaining gas of a Ge material or an Sb material, especially an Sb material, the decomposition of the Te compound is facilitated such that Te can be deposited (adsorbed). At this time, it is believed that because the Te material is supplied for a somewhat long period of time in the Te material adsorption step so that the remaining amount of the Te material is increased and thus, the probability of being contacted with the remaining gas of the Sb material is increased, the Te concentration in the film may be increased. However, in a case where the adsorption of Te at step 14 is performed after Ge has been adsorbed at step 13, it is believed that as the supplying time of the Ge material is increased, the Ge concentration in the film is abruptly increased to a certain critical value and the Te concentration is reduced, as illustrated in FIG. 8 and thus, the composition ratio becomes difficult to control. This is believed because the contact probability of the remaining gas of the Sb material and the Te material gas is substantially reduced as the supplying time of the Ge material is increased.

Figure 9:
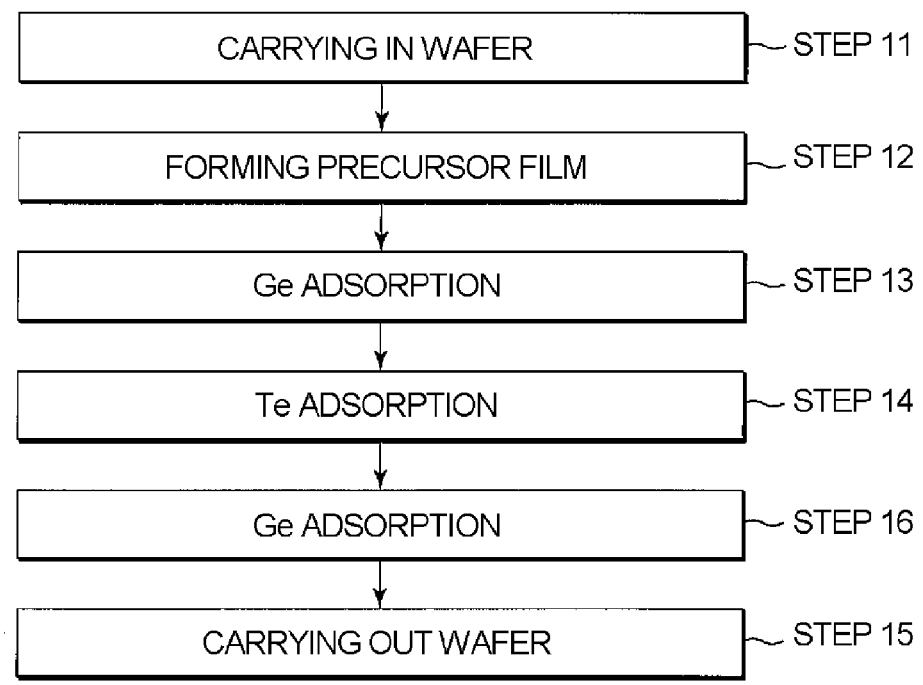
FIG. 9 is a flowchart illustrating a modified example of the second exemplary embodiment of the first aspect of the film forming method according to the present disclosure.

The Ge—Sb—Te film formed of $Ge_2Sb_2Te_5$ may be allowed to be formed up to step 14. However, when the adsorption of Te is performed as the final step, the composition controllability may be degraded due to the volatilization of Te. In such a case, as illustrated in FIG. 9, the supply of the Te material gas is stopped after step 14, and step 16 is performed to cause the Ge material gas to flow so that Ge is caused to be adsorbed. In the case where step 16 is performed, the Ge concentration in the film remains lower than that in $Ge_2Sb_2Te_5$ at step 13 and the final composition is adapted to be adjusted at step 16. When the adsorption of Ge is performed at step 16, the volatilization of Te is suppressed and thus, the composition controllability is further enhanced.

Also in the second exemplary embodiment, a precursor film, which does not contain Te or contains only a small amount of Te, is formed at first, and then the adsorption of Te and Ge is performed. Accordingly, the deterioration of surface flatness and the degradation of stability in Te concentration may be suppressed which are caused due to a large amount of Te as in the case where the Ge—Sb—Te film with the composition of $Ge_2Sb_2Te_5$ is formed by one-step deposition.

[Effect of First Aspect]

According to the first aspect, when a Ge—Sb—Te film formed of $Ge_2Sb_2Te_5$ is formed on a substrate by CVD, by introducing a gaseous Ge material and a gaseous Sb material, or alternatively a small amount of a gaseous Te material not sufficient to form $Ge_2Sb_2Te_5$ to be formed in addition to the gaseous Ge and Sb materials into the process chamber so that a precursor film which does not contain Te or contains Te in an amount smaller than that of $Ge_2Sb_2Te_5$ is formed on the substrate, and then introducing the gaseous Te material into the process chamber to cause Te to be adsorbed to the film so that the concentration of Te in the film is adjusted. Therefore, the deterioration of surface flatness or the degradation of stability in Te concentration may be suppressed which are caused due to a large amount of Te as in the case where the gaseous materials are supplied in a lump.

[Second Aspect]

In the present aspect, in forming a Ge—Se—Te film of which the composition ratio equals to that of $Ge_2Sb_2Te_5$ on a substrate by disposing a wafer in a process chamber and using a gaseous Ge material, a gaseous Sb material, and a gaseous Te material, the steps of alternately supplying a Ge compound that contains an amino group or an amidine group as the gaseous Ge material and a reaction gas that decomposes the amino group or the amidine group into process chamber 1 by a predetermined number of times to form a Ge film, alternately supplying an Sb compound that contains an amino group or an amidine group as the gaseous Sb material and a reaction gas that decomposes the amino group or the amidine group into process chamber 1 by a predetermined number of times to form an Sb film, after the Ge film and the Sb film are formed, alternately supplying a Te compound that contains an alkyl group as the gaseous Te material and a purge gas into the process chamber by a predetermined number of times to form a Te film are repeated by a predetermined number of times.

Figure 10:
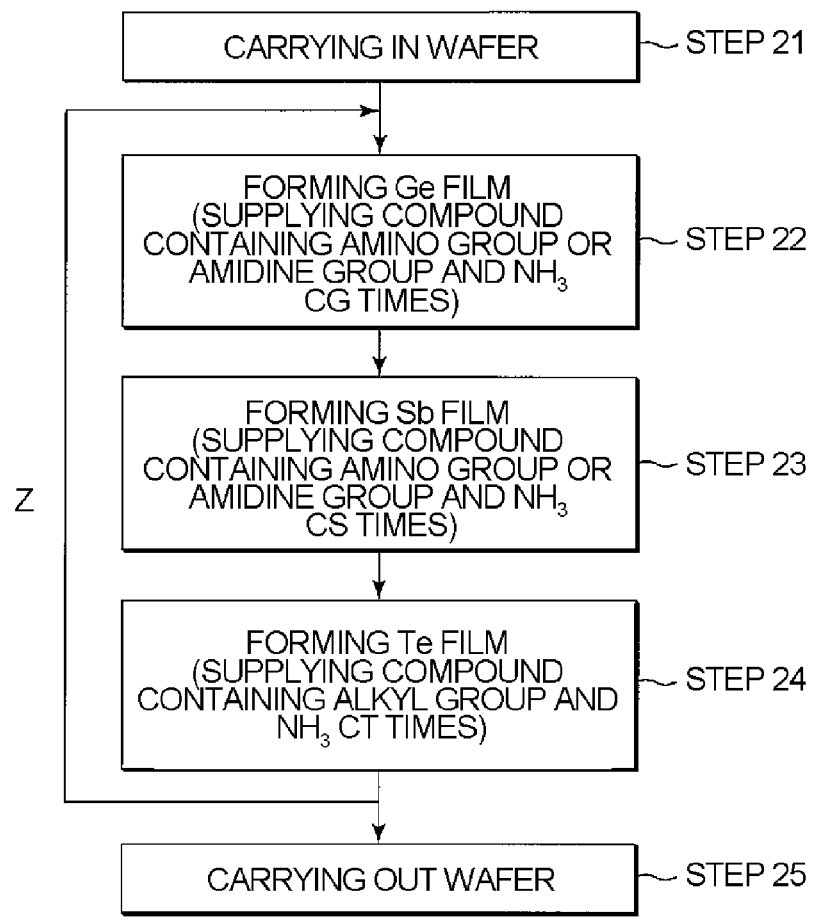
FIG. 10 is a flowchart illustrating the second aspect of the film forming method according to the present disclosure.

Hereinafter, a specific film forming method according to the second aspect will be described with reference to FIG. 10.

First, as in step 1 in the first aspect, a wafer W is introduced into process chamber 1 and disposed on mounting table 3 (step 21). Then, wafer W is heated.

Next, a Ge compound gas that contains an amino group or an amidine group as the Ge material gas and $NH_3$ gas which is a reaction gas that decomposes the amino group or the amidine group are alternately supplied into process chamber 1 by CG times to form a Ge film with a predetermined film thickness (step 22). By using the Ge compound gas that contains the amino group or the amidine group and the $NH_3$ gas which is the reaction gas that decomposes the amino group or the amidine group, the Ge film may be formed alone.

Next, an Sb compound gas that contains an amino group or an amidine group as the Sb material gas and $NH_3$ gas which is a reaction gas that decomposes the amino group or the amidine group are alternately supplied into process chamber 1 by CS times to form an Sb film with a predetermined film thickness (step 23). Like the Ge film, by using the Sb compound gas that contains the amino group or the amidine group and the $NH_3$ gas which is the reaction gas that decomposes the amino group or the amidine group, the Sb film may be formed alone. As for the reaction gas that decomposes the amino group or the amidine group, $NH_3$, monomethylhydrazine ($CH_3$—$NH$—$NH_2$), pyridine ($C_5H_5N$), and a gas obtained by diluting these gases with hydrogen may be used.

Next, after the Ge film and the Sb film are formed, a Te compound gas that contains an alkyl group as the Te material gas and $NH_3$ gas as a purge gas are alternately supplied into process chamber 1 by CT times to form a Te film with a predetermined film thickness (step 24). The Te compound is hard to be decomposed alone to such an extent that Te is deposited (adsorbed) at a film forming temperature of 230° C. to 360° C. but is enabled to be deposited as the remaining gas of the Ge material and the Sb material exists. In particular, by forming the Te film after the Sb film is formed, the film forming amount of Te may be increased. As for the purge gas at the time of forming the Te film, an inert gas, such as for example, Ar and $N_2$, $H_2$ gas, and $NH_3$ gas may be used. For the purge effect, the inert gas may be sufficient. However, the $H_2$ gas has an effect of facilitating the pyrolysis of the Te compound that contains the alkyl group, the $NH_3$ gas may be used together with the reaction gas at the time of forming the Ge film and the Sb film, and when the $NH_3$ gas is supplied, the quality of the Te film may be improved.

In addition, in the present aspect, steps 22 to 24 are repeated by Z times. As a result, a Ge—Sb—Te formed of $Ge_2Sb_2Te_5$ may be formed. In addition, when the forming of a predetermined film is terminated, wafer W is carried out as in steps 4 and 15 in the first aspect (step 25).

At this time, the composition and the thickness of the film may be controlled by controlling the pressure in process chamber 1, the supplying time and the flow rate at the time when supplying each gas, and may be controlled by the above-described repeating number of times CG, CS, CT and Z. The $Ge_2Sb_2Te_5$ film produced in this manner is alloyed during the film forming and does not exhibit a remarkable deviation in composition when the composition distribution is measured in the depth direction of the film using an X-ray photoelectron spectroscopy (XPS).

Figure 11A:
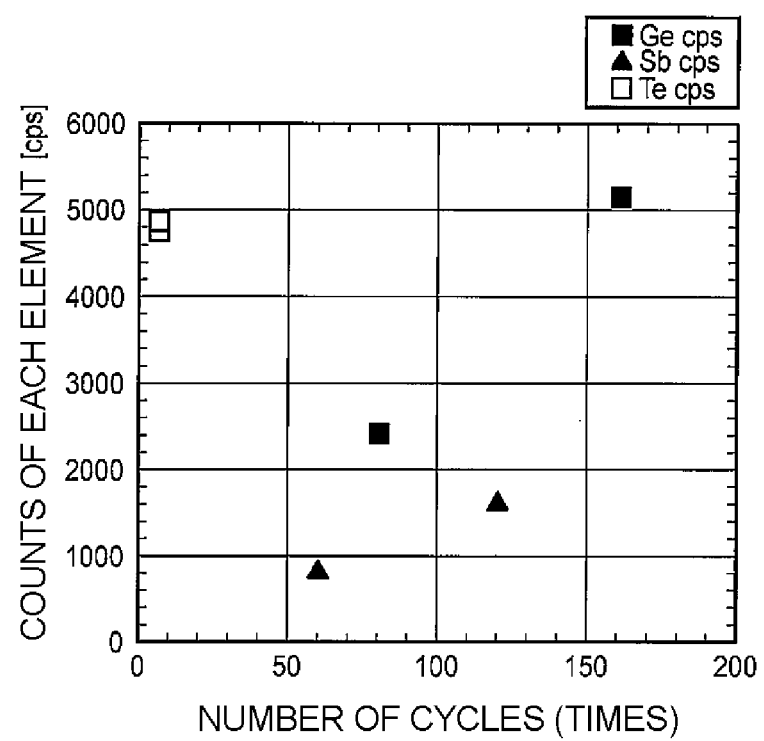
FIG. 11A illustrates results obtained when the second aspect of the film forming method was performed using a compound that contains an amino group or an amidine group as the Ge material and the Sb material and a Te compound that contains an alkyl group as the Te material, in which a relationship between the number of cycles CG, CS, and CT of each process and counts (cps) of Ge, Sb, and Te in a film obtained by a fluorescence X-ray analysis is illustrated.
Figure 11B:
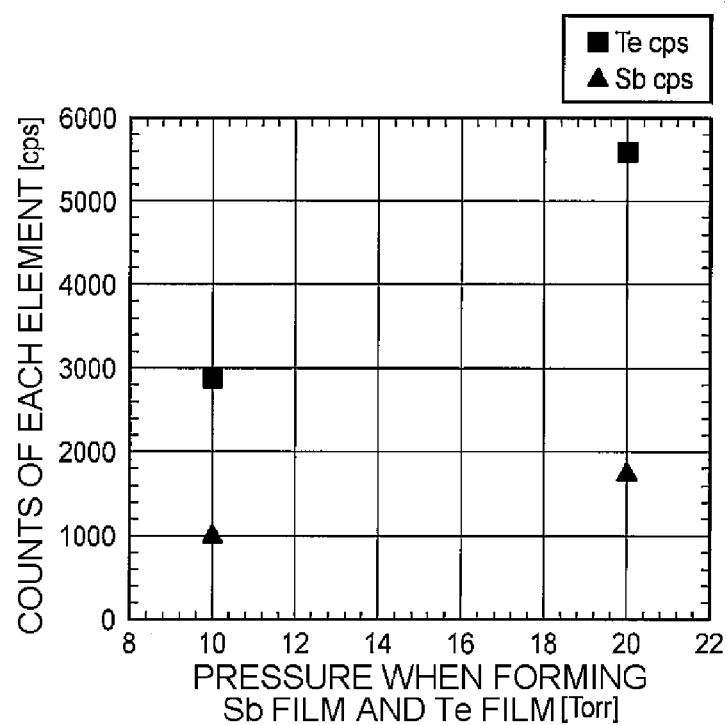
FIG. 11B illustrates results obtained when the second aspect of the film forming method was performed using a compound that contains an amino group or an amidine group as the Ge material and the Sb material, in which a relationship between the pressure in the inside of the process chamber when forming a film and counts of Ge and Sb in a film obtained by a fluorescence X-ray analysis is illustrated.

FIGS. 11A and 11B illustrate results when the film forming according to the present aspect was performed using GeM (trademark) manufactured by ATMI as the Ge compound that contains an amino group or an amidine group which is a Ge material, $Sb(N(CH_3)_2)_3$ as the Sb compound that contains an amino group or an amidine group which is an Sb material, and $Te(t-C_4H_9)_2$ as the Te compound that contains an alkyl group which is the Te material, in which FIG. 11A illustrates a relationship between the number of cycles of each step CG, CS, CT and the counts (cps) of Ge, Sb, and Te of a film which were calculated by a fluorescent X-ray analysis (XRF), and FIG. 11B illustrates a relationship between the pressure in the process chamber at the time of forming each of Sb and Te films and the counts (cps) of Sb and Te in the films which were calculated by the fluorescent X-ray analysis (XRF).

FIG. 11A illustrates two kinds of Ge—Sb—Te films, i.e., a Ge—Sb—Te film formed by performing steps 22 to 24 in which CG=80, CS=30 and CT=3, and repeating this twice, and a Ge—Sb—Te film formed by performing steps 22 to 24 in which CG=40, CS=60 and CT=1, and repeating this twice. In addition, when these Ge—Sb—Te films are expressed by $(Ge_{80}Sb_{30}Te_3)\times 2$ and $(Ge_{40}Sb_{60}Te_1)\times 2$, respectively, the film of $(Ge_{80}Sb_{30}Te_3)\times 2$ corresponds to a film in which the number of Ge cycles is 160 and the number of Sb cycles is 60, and the film of $(Ge_{40}Sb_{60}Te_1)\times 2$ corresponds to a film in which the number of Ge cycles is 80 and the number of Sb cycles is 120.

Figure 12:
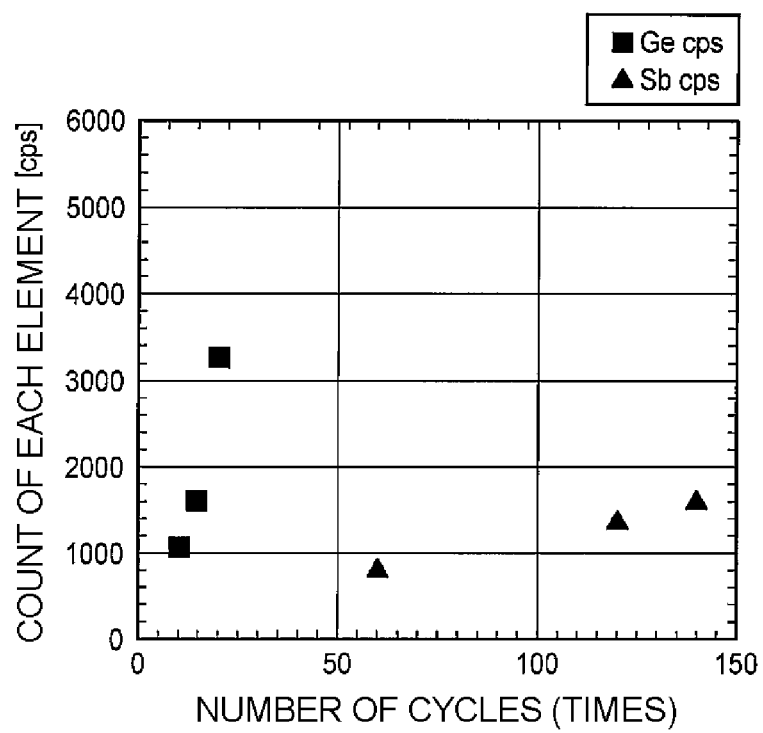
FIG. 12 illustrates results when the second aspect of the film forming method was performed using a compound that contains an amino group or an amidine group as the Ge material and the Sb material and a Te compound that contains an alkyl group for the Te material, in which a relationship between the number of cycles CG and CS when forming a Ge film and an Sb film and the counts (cps) of Ge and Sb in a film obtained by a fluorescence X-ray analysis is illustrated.

FIG. 12 illustrates results when the film forming method according to the present aspect was performed using TSC-Ge07 (trademark) manufactured by Tri Chemical Lab as the Ge compound that contains an amino group or an amidine group which is a Ge material, $Sb(N(CH_3)_2)_3$ as the Sb compound that contains an amino group or an amidine group which is an Sb material, and TSC-Te06 (trademark) manufactured by Tri Chemical Lab as the Te compound that contains an alkyl group which is a Te material, in which a relationship between the number of cycles CG and CS when a Ge film and an Sb film were formed and the counts (cps) of Ge and Sb in the films which were calculated by the fluorescence X-ray analysis (XRF).

Although not illustrated in FIG. 12 as to Te, CT was 1. In addition, FIG. 12 illustrates the results for three kinds of Ge—Sb—Te films, i.e. a Ge—Sb—Te film formed by performing steps 22 to 24 in which CG=5, CS=60 and CT=1, and repeating this twice, a Ge—Sb—Te film formed by performing steps 22 to 24 in which CG=7, CS=70 and CT=1, and repeating this twice, and a Ge—Sb—Te film formed by performing steps 22 to 24 in which CG=10, CS=30 and CT=1, and repeating this twice. In addition, when these Ge—Sb—Te films are expressed by $(Ge_5Sb_{60}Te_1)\times 2$, $(Ge_7Sb_{70}Te_1)\times 2$, and $(Ge_{10}Sb_{30}Te_1)\times 2$, respectively, the film of $(Ge_5Sb_{60}Te_1)\times 2$ corresponds to a film in which the number of Ge cycles is 10 and the number of Sb cycles is 120, the film of $(Ge_7Sb_{70}Te_1)\times 2$ corresponds to a film in which the number of Ge cycles is 14 and the number of Sb cycles is 140, and the film of $(Ge_{10}Sb_{30}Te_1)\times 2$ corresponds to a film in which the number of Ge cycles is 20 and the number of Sb cycles is 60.

From FIGS. 11A and 12, it was confirmed that the film forming amount may be increased by increasing the number of cycles when forming each of the Ge, Sb and Te films. In addition, from FIG. 11B, it was confirmed that the film forming amount may also be increased by increasing the pressure in the process chamber at the time of supplying a material gas.

Desired conditions in the second aspect are set forth below.

Forming of Ge Film (step 22)

Flow rate of carrier gas of Ge material: 20 mL/min (sccm) to 500 mL/min (sccm)

Pressure at the time of supplying Ge material gas: 133 Pa to 2,660 Pa (1 Torr to 20 Torr)

Supplying time of Ge material gas: 2 sec to 120 sec

Flow rate of NH$_3$ gas: 50 mL/min (sccm) to 500 mL/min (sccm) Pressure at the time of supplying NH$_3$ gas: 133 Pa to 2,666 Pa (1 Torr to 20 Torr)
Supplying time of NH$_3$ gas: 10 sec to 120 sec
Number of cycles CG: optional
Forming of Sb Film (step 23)
Flow rate of carrier gas of Sb material: 20 mL/min (sccm) to 500 mL/min (sccm)
Pressure at the time of supplying Sb material gas: 133 Pa to 6,665 Pa (1 Torr to 50 Torr)
Supplying time of Sb material gas: 2 sec to 120 sec
Flow rate of NH$_3$ gas: 50 mL/min (sccm) to 500 mL/min (sccm)
Pressure at the time of supplying NH$_3$ gas: 133 Pa to 6,665 Pa (1 Torr to 50 Torr)
Supplying time of NH$_3$ gas: 10 sec to 120 sec
Number of cycles CS: optional
Forming of Te Film (step 24)
Flow rate of carrier gas of Te material: 10 mL/min (sccm) to 200 mL/min (sccm)
Pressure at the time of supplying Te material gas: 1,333 Pa to 6,665 Pa (10 Torr to 50 Torr)
Supplying time of Te material gas: 10 sec to 120 sec
Flow rate of NH$_3$ gas: 50 mL/min (sccm) to 500 mL/min (sccm)
Pressure at the time of supplying NH$_3$ gas: 133 Pa to 6,665 Pa (1 Torr to 50 Torr)
Supplying time of NH$_3$ gas: 10 sec to 120 sec
Number of cycles CT: optional
Number of repeating times Z: optional In the second aspect, the Ge film, Sb film and Te film are independently formed by alternately supplying the material gases thereof and the NH$_3$ gas, and the alternate supplying of the material gases thereof and the NH$_3$ gas are performed plural times, the deterioration of surface flatness and the degradation of stability in Te concentration may be suppressed which are caused due to a large amount of Te as in the one-step deposition. In addition, by forming a film in this manner, the controllability of composition and film thickness of the film may be enhanced.

Next, descriptions will be made as to the test results when a Ge—Sb—Te film was formed in fact according to the second aspect.

Here, in the film forming apparatus of FIG. 1, the temperature of the mounting table was set to 260° C. by adjusting the power of the lamps, a wafer of a disc shape with a diameter of 200 mm was introduced into using an arm of a transfer robot, and a Ge—Sb—Te film was formed with the conditions set forth below. In addition, as for the Ge compound that contains an amino group or an amidine group which is a Ge material, GeM (trademark) manufactured by ATMI was used, as for the Sb compound that contains an amino group or an amidine group which is an Sb material, Sb(N(CH$_3$)$_2$)$_3$ was used, and as for the Te compound that contains an alkyl group which is a Te material, Te(t-C$_4$H$_9$)$_2$ was used.

In addition, a Ge—Sb—Te based film was formed under the following conditions.

Forming of Ge Film (step 22)
Flow rate of carrier gas of Ge material: 500 mL/min (sccm)
Pressure at the time of supplying Ge material gas: 665 Pa (5 Torr)
Supplying time of Ge material gas: 5 sec
Flow rate of NH$_3$ gas: 500 mL/min (sccm)
Pressure at the time of supplying NH$_3$ gas: 665 Pa (5 Torr)
Supplying time of NH$_3$ gas: 5 sec
Number of cycles CG: 40 times
Forming of Sb Film (step 23)
Flow rate of carrier gas of Sb material: 50 mL/min (sccm)
Pressure at the time of supplying Sb material gas: 2,666 Pa (20 Torr)
Supplying time of Sb material gas: 5 sec
Flow rate of NH$_3$ gas: 500 mL/min (sccm)
Pressure at the time of supplying NH$_3$ gas: 2,666 Pa (20 Torr)
Supplying time of NH$_3$ gas: 5 sec
Number of cycles CS: 60 times
Forming of Te Film (step 24)
Flow rate of carrier gas of Te material: 100 mL/min (sccm)
Pressure at the time of supplying Te material gas: 2,666 Pa (20 Torr)
Supplying time of Te material gas: 60 sec
Flow rate of NH$_3$ gas: 500 mL/min (sccm)
Pressure at the time of supplying NH$_3$ gas: 2,666 Pa (20 Torr)
Supplying time of NH$_3$ gas: 5 sec
Number of cycles CT: 3 times
Number of repeating times Z: twice The film thickness of the film formed as described above was 48 nm. It was confirmed that the film composition was Ge: 23 at %, Sb: 23 at %, and Te: 54 at % which substantially corresponds to the composition of Ge$_2$Sb$_2$Te$_5$, and the composition controllability was good. The flatness of the film surface was also good.

[Effect of Second Aspect]

According to the second aspect, a Ge—Se—Te based film formed of Ge$_2$Sb$_2$Te$_5$ is formed by repeating, by a predetermined number of times, the steps of alternately supplying a Ge compound that contains an amino group or an amidine group and a reaction gas that decomposes the amino group or the amidine group into a process chamber by a predetermined number of times to form a Ge film, alternately supplying a Sb compound that contains an amino group or an amidine group and a reaction gas that decomposes the amino group or the amidine group by a predetermined number of times to form an Sb film, and, after the Ge film and the Sb film are formed, alternately supplying a Te compound that contains an alkyl group and a purge gas into the process chamber by a predetermined number of times to form a Te film. As a result, the deterioration of surface flatness and the degradation of stability in Te concentration may be suppressed which are caused due to a large amount of Te as in the case where the gaseous materials are supplied in a lump. In addition, by forming a film in this manner, the controllability of the composition and film thickness of the film may be enhanced.

<Other Application>

The present disclosure is not limited to the above-described aspects and may be variously limited. For example, although it has described that a substrate to be processed is heated by a lamp in a film forming apparatus, the substrate may be heated by a resistance heating heater. In addition, although an example of applying the Ge—Sb—Te film to a phase change layer in a PRAM was described in the above-described aspect, the Ge—Sb—Te film may be applied to a record layer of a phase change type optical storage medium.

What is claimed is:

1. A method of forming a Ge—Sb—Te film formed of Ge$_2$Sb$_2$Te$_5$ on a substrate by CVD by disposing the substrate in a process chamber and using a gaseous Ge material, a gaseous Sb material, and a gaseous Te material, the method comprising:

introducing the gaseous Ge material and the gaseous Sb material, or a small amount of the gaseous Te material not sufficient to form Ge$_2$Sb$_2$Te$_5$ in addition to the gaseous Ge material and the gaseous Sb material into the process chamber so that a precursor film which does not contain Te or contains Te in an amount smaller than that in $Ge_2Sb_2Te_5$ is formed on the substrate;

after forming the precursor film, introducing the gaseous Ge material into the process chamber to cause Ge to be adsorbed to the precursor film; and after Ge is adsorbed to the precursor film by introducing the gaseous Ge material into the process chamber, introducing the gaseous Te material into the process chamber to cause Te to be adsorbed to the precursor film so that the concentration of Te in the precursor film is adjusted, wherein when forming the precursor film, the gaseous Ge material and the gaseous Sb material or the small amount of the gaseous Te material not sufficient to form $Ge_2Sb_2Te_5$ in addition to the gaseous Ge material and the gaseous Sb material are supplied in a lump, and wherein the precursor film contains Ge in an amount smaller than that in $Ge_2Sb_2Te_5$.

2. The method of claim 1, further comprising causing Ge to be adsorbed to the precursor film again, which is performed after Ge is adsorbed to the precursor film and then Te is adsorbed to the precursor film.

3. The method of claim 1, wherein the Ge material and the Sb material are a Ge compound that contains an amino group or an amidine group and an Sb compound that contains an amino group or an amidine group, respectively, and when forming the precursor film, a reaction gas that decomposes the amino group or the amidine group is supplied simultaneously with the Ge compound and the Sb compound.

4. The method of claim 3, wherein the Te material is a compound that contains an alkyl group.

* * * * *